United States Patent
Soudier et al.

(10) Patent No.: US 7,362,557 B2
(45) Date of Patent: Apr. 22, 2008

(54) METHOD, APPARATUS AND ARTICLE FOR BI-DIRECTIONAL DC/DC POWER CONVERSION

(75) Inventors: Christophe Soudier, Ypsilanti, MI (US); Lizhi Zhu, Canton, MI (US); Vinod Reddy, Novi, MI (US); Venkatapathi R. Nallapa, West Bloomfield, MI (US)

(73) Assignee: Continental Automotive Systems U.S. Inc., Auburn Hills, MI (US)

( * ) Notice: Subject to any disclaimer, the term of this patent is extended or adjusted under 35 U.S.C. 154(b) by 297 days.

(21) Appl. No.: 11/096,236

(22) Filed: Mar. 30, 2005

(65) Prior Publication Data

US 2005/0254273 A1 Nov. 17, 2005

Related U.S. Application Data

(60) Provisional application No. 60/558,521, filed on Mar. 30, 2004.

(51) Int. Cl.
*H02H 5/04* (2006.01)
*H02H 9/02* (2006.01)

(52) U.S. Cl. ............. 361/93.8; 361/103; 361/93.9; 700/299; 700/300; 702/132

(58) Field of Classification Search ........... 361/93.8, 361/103; 700/299, 300; 702/132
See application file for complete search history.

(56) References Cited

U.S. PATENT DOCUMENTS

| | | | |
|---|---|---|---|
| 5,134,355 A * | 7/1992 | Hastings | 323/211 |
| 5,402,059 A | 3/1995 | Bittar | 323/223 |
| 6,078,511 A * | 6/2000 | Fasullo et al. | 363/50 |
| 6,452,815 B1 | 9/2002 | Zhu et al. | 363/17 |
| 6,504,694 B1 * | 1/2003 | Bilac et al. | 361/93.2 |
| 6,587,356 B2 | 7/2003 | Zhu et al. | 363/17 |
| 6,646,837 B2 | 11/2003 | West | 361/42 |
| 6,778,411 B2 | 8/2004 | Huang | 363/49 |
| 6,876,556 B2 | 4/2005 | Zhu et al. | 363/17 |
| 7,042,180 B2 * | 5/2006 | Terry et al. | 318/434 |
| 7,079,406 B2 * | 7/2006 | Kurokami et al. | 363/56.03 |
| 7,137,015 B2 * | 11/2006 | Su | 713/300 |
| 2002/0162673 A1 | 11/2002 | Cook et al. | 174/35 |
| 2002/0196646 A1 | 12/2002 | Cook et al. | 363/141 |
| 2003/0157379 A1 | 8/2003 | Kambouris et al. | 429/9 |
| 2003/0198064 A1 | 10/2003 | Zhu et al. | 363/21.01 |
| 2003/0214826 A1 | 11/2003 | Zhu et al. | 363/132 |
| 2004/0047092 A1 | 3/2004 | West | 361/42 |

OTHER PUBLICATIONS

U.S. Appl. No. 60/246,273, filed Nov. 6, 2000, West.
U.S. Appl. No. 60/255,371, filed Dec. 13, 2000, Hatch et al.
U.S. Appl. No. 60/270,703, filed Feb. 22, 2001, Zhu et al.
U.S. Appl. No. 60/271,184, filed Feb. 23, 2001, Zhu et al.
U.S. Appl. No. 60/319,070, filed Jan. 16, 2002, Zhu et al.
U.S. Appl. No. 60/319,071, filed Jan. 16, 2002, Kambouris et al.
U.S. Appl. No. 60/319,116, filed Feb. 20, 2002, Zhu et al.

* cited by examiner

*Primary Examiner*—Michael Sherry
*Assistant Examiner*—Zeev Kitov

(57) ABSTRACT

A controller implements a state machine for operating the bi-directional power converter with a flexible load pattern while maintaining a thermal condition of the power converter within acceptable limits. The state machine implements a wait loop in response to selected conditions to maintain the thermal condition.

7 Claims, 5 Drawing Sheets

METHOD, APPARATUS AND ARTICLE FOR BI-DIRECTIONAL DC/DC POWER CONVERSION

BACKGROUND OF THE INVENTION

1. Field of the Invention

This disclosure is generally related to power conversion, and particularly to bi-directional power conversion via a DC/DC switch mode power converter.

2. Description of the Related Art

A variety of applications employ DC/DC power conversion to, for example, step-up and/or step-down voltage. For example, electric drive or hybrid automotive applications may at times provide power from a high voltage DC source, such as one or more fuel cells, to supply low voltage DC loads and/or to recharge one or more batteries and/or ultracapacitors. During other times, a low voltage power source, such as one or more of the batteries and/or ultracapacitors, may provide power to a high voltage DC load, such as an electric traction motor coupled to drive one or more wheels via a drivetrain.

Switch mode converters typically offer higher efficiency than linear regulators, and can step-up or step-down the input voltage. In some embodiments, switch mode converters can even invert the input voltage. A variety of switch mode DC/DC converter topologies and operation of the same are known to those of skill in the art. For example, buck converters for stepping down the input voltage, boost converters for stepping up the input voltage, as well as buck-boost converters and flyback converters for alternatively stepping down and stepping up the input voltage.

DC/DC switch mode converter operation is typically limited by thermal constraints, such as the ability to dissipate heat generated by the conversion process. This may be disadvantageous, particularly where some flexibility is desired in the load pattern during boost mode operation of the DC/DC converter. It would thus be desirable to increase the flexibility of operation of the DC/DC converter, while avoiding thermal damage to the DC/DC converter from excessive accumulation of heat.

BRIEF SUMMARY OF THE INVENTION

A controller implements a state machine for operating the bi-directional power converter with a flexible load pattern while maintaining a thermal condition of the power converter within acceptable limits. The state machine implements a wait loop in response to selected conditions to maintain the thermal condition.

In one embodiment, a method of operating a bi-directional power converter, the method comprises: monitoring command and condition signals; and selectively supplying control signals to cause the bi-directional power converter to cycle between a plurality of operational modes based on the monitored command and condition signals, the plurality of operational modes comprising: a ready mode; a buck mode; a boost mode; a fault mode; and a first wait mode.

In one embodiment, selectively supplying control signals comprises supplying control signals to cause the bi-directional power converter to cycle from the boost mode to the first wait mode based in part on the condition signals. In one embodiment selectively supplying control signals comprises determining whether a thermal condition has been reached based in part on the condition signals. In one embodiment, the condition signals comprise an input current.

In one embodiment, selectively supplying control signals comprises supplying control signals to cause the bi-directional power converter to cycle from the boost mode to the first wait mode when an integrated value of an input current exceeds a threshold input current by a defined value.

In one embodiment, the plurality of operational modes further comprises a second wait mode. In one embodiment, selectively supplying control signals comprises supplying control signals to cause the bi-directional power converter to operate in the first wait mode for a first defined period of time and selectively supplying control signals to cause the bi-directional power converter to operate in the second wait mode for a second defined period of time.

In one embodiment, selectively supplying control signals comprises supplying control signals to cause the bi-directional power converter to operate in the fault mode in response to detection of a fault condition. In one embodiment the method further comprises applying a hardware-based over-protection limit to the operation of the bi-directional power converter. In one embodiment the method further comprises applying a software-based over-protection limit to the operation of the bi-directional power converter.

In one embodiment, a system for controlling a power converter, comprises: a fault detection monitor configured to generate a fault signal in response to a fault condition; a state machine configured to transition between a plurality of states comprising a ready state, a boost state, a buck state, a fault state, a first wait state, and a second wait state, wherein the state machine is configured to transition from the boost state to the first wait state in response to an indication of a thermal condition; and a control signal generator configured to generate control signals for controlling the power converter based on a current state of the state machine.

In one embodiment, the state machine is configured to transition between states in the plurality of states based on a received command and the fault signal. In one embodiment, the indication of a thermal condition is a function of a current level. In one embodiment, the indication of a thermal condition is a function of a current level and time. In one embodiment the indication of a thermal condition is an integrated value of an input current in excess of a threshold input current.

In one embodiment, a system for controller a power converter comprises: means for detecting fault conditions; means for transitioning between a plurality of states comprising a boost state, a first wait state and a second wait state; and means for generating control signals coupled to the means for detecting fault conditions and the means for transitioning between a plurality of states.

In one embodiment, the means for transitioning between a plurality of states comprises a state machine implemented in a computer-readable media. In one embodiment, the plurality of states comprises a buck state and a fault state. In one embodiment, the means for transitioning is configured to transition from the boost state to the first wait state in response to an indication of a thermal condition. In one embodiment, the indication of a thermal condition is a function of an input current.

In one embodiment, a computer-readable memory medium stores instructions for causing a control system to control a power converter by: monitoring command and condition signals; and selectively supplying control signals to cause the power converter to cycle between a plurality of operational modes based on the monitored command and condition signals, the plurality of operational modes comprising: a ready mode; a buck mode; a boost mode; a fault mode; and a first wait mode. In one embodiment, the plurality of operational modes further comprise a second wait mode. In one embodiment, the stored instructions further comprise instructions for causing the control system to control the power converter by: selectively generating control signals to cause the power converter to cycle from the boost mode to the first wait mode; and selectively generating control signals to cause the power converter to cycle from the boost mode to the second wait mode.

In one embodiment, the stored instructions further comprise instructions for causing the control system to control the power converter by: selectively supplying control signals to cause the power converter to cycle from the boost mode to the first wait mode in response to an indication of a thermal condition. In one embodiment, the indication of a thermal condition is a function of an input current.

DEFINITIONS AND BRIEF DESCRIPTION OF THE DRAWINGS

In the drawings, identical reference numbers identify similar elements or acts. The sizes and relative positions of elements in the drawings are not necessarily drawn to scale. For example, the shapes of various elements and angles are not drawn to scale, and some of these elements are arbitrarily enlarged and positioned to improve drawing legibility. Further, the particular shapes of the elements as drawn, are not intended to convey any information regarding the actual shape of the particular elements, and have been solely selected for ease of recognition in the drawings.

FIG. 1 is a schematic diagram of a power system comprising a high voltage power source such as a fuel cell system, a low voltage load and/or power source such as a battery and/or ultracapacitor, a bi-directional power converter operable to transfer power between a high voltage bus and a low voltage bus, and an optional high voltage load such as a traction motor, the power system suitable for a variety of applications, for example, suitable for use in an electric or hybrid vehicle, according to one illustrated embodiment.

DETAILED DESCRIPTION OF THE INVENTION

In the following description, certain specific details are set forth in order to provide a thorough understanding of various embodiments. However, one skilled in the art will understand that other embodiments may be practiced without these details. In other instances, well-known structures associated with power converters, switched mode power converters, controllers, fuel cell systems, uninterruptible power supplies, batteries and/or ultracapacitors have not been shown or described in detail to avoid unnecessarily obscuring descriptions of the embodiments.

Unless the context requires otherwise, throughout the specification and claims which follow, the word "comprise" and variations thereof, such as, "comprises" and "comprising" are to be construed in an open, inclusive sense, that is as "including, but not limited to."

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Further more, the particular features, structures, or characteristics may be combined in any suitable manner in one or more embodiments.

The headings provided herein are for convenience only and do not interpret the scope or meaning of the claimed invention.

Figure 1:
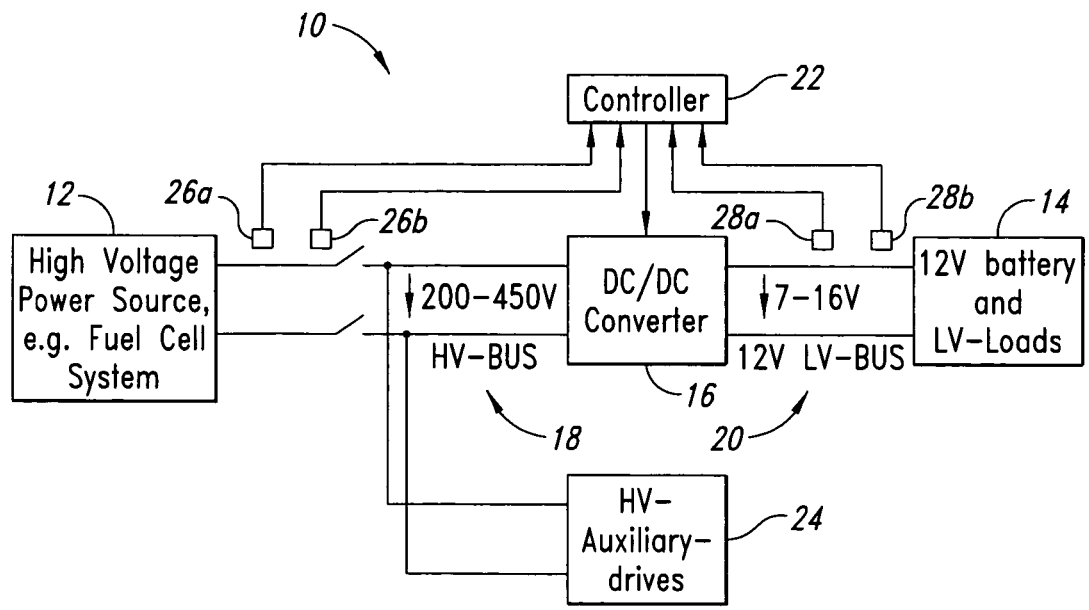

FIG. 1 shows a power system 10 suitable for a variety of applications, for example, for use in an electric or hybrid vehicle, or as an auxiliary power supply such as an uninterruptible power supply (UPS). The power system 10 comprises one or more high voltage DC power sources 12, one or more low voltage DC loads 14, a DC/DC switch mode power converter 16 coupled and operable to transfer DC power between the DC power source 12 and DC loads 14 via a high voltage DC bus (e.g., 200-450V HV-BUS) 18 and a low voltage DC bus (12V LV-Bus) 20. The power system also comprises a controller 22 coupled to control the power converter 16. The power system 10 may further comprise one or more high voltage loads 24.

While FIG. 1 identifies suitable voltages for an automotive application, such voltages are merely exemplary and the power system 10 may employ other voltages and other relative voltage levels for automotive as well as other applications. Thus, as used herein and in the claims, the terms high voltage and low voltage are not intended to denominate any specific voltage or voltage range, but rather are used in a relative sense with respect to one another.

In particular, the high voltage power source 12 may take a variety of forms, for example, a fuel cell stack comprising a plurality of fuel cells, such as proton exchange membrane (PEM) fuel cells. The connection between the high voltage power source 12 and the power converter 16 may take place within a protective housing of the power converter 16.

The low voltage load 14 may take a variety of forms, for example, one or more low voltage devices such as monitoring or control systems for the power system 10 or a device associated with the power system 10, for example an electric or hybrid vehicle. The low voltage load 14 may additionally, or alternatively comprise one or more power storage devices, such as one or more batteries and/or one or more ultracapacitors, which act as low voltage loads while being recharged, and act as low voltage power sources when being discharged.

The high voltage load 24 may take a variety of forms such as a high voltage traction drive motor, and/or one or more high voltage auxiliary drive motors such as a compressor, fan and/or pump associated with the power system 10 and/or a device associated with the power system 10 such as an electric or hybrid vehicle.

The power converter 16 may provide galvanic isolation between the high and low voltage buses 18, 20, respectively, for example via a transformer (not shown). The power converter 16 is operable to adjust voltage output in response to pulse width modulated (PWM) input signals. Thermal cooling may be provided by a glycol electronics cooling loop, for example, with a flow rate of approximately 8 liters/minute. The power converter 16 may also include suitable automatic over load and/or over temperature features for reducing or shedding load and/or heat.

The controller 22 may take a variety of forms such as a programmed or programmable microprocessor, digital signal processor (DSP), application specific integrated circuit (ASIC), and/or discrete circuit. The controller 22 provides control signals to one or more switches in the power converter 16. The controller 22 may receive input signals from one or more sensors and/or devices. For example, the controller 22 may receive high voltage side voltage and/or current measurements from voltage sensor 26a and/or current sensor 26b. Additionally, or alternatively, the controller 22 may receive low voltage side voltage and/or current measurements from voltage sensor 28a and/or current sensor 28b. Additionally or alternatively, the controller 22 may receive signals from actuators or sensors associated with other components of the power system 10, such as pedals, motors, compressors, fans, etcetera.

Figure 2:
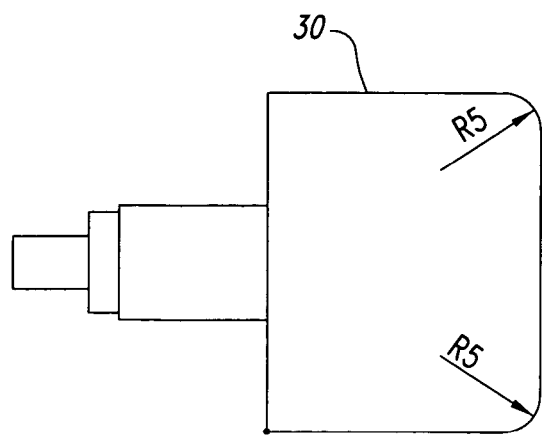
FIG. 2 is a top plan view of a low voltage connector suitable for making electrical coupling between the power converter and the low voltage loads and/or low voltage power sources.

FIG. 2 shows a 2-pole chassis isolated low voltage connector 30 suitable for connecting the low voltage DC bus 20 to the power converter 16. In particular, the portion of the low voltage load 14 acting as a power source, such as batteries and/or ultracapacitors, may be coupled to a vehicle circuit via a 2-pole connection.

With continuing reference to FIG. 1, the controller 22 can provide control signals to the power converter 16 to operate the power converter 16 in a variety of modes, including a boost mode and a buck mode. In the boost mode, the power converter 16 transfers energy from the low voltage bus 20 (e.g., from the 12V battery) to the high voltage bus 18, for example, to provide power during the start-up process of the high voltage power source 12 (e.g., the fuel cell system). In buck mode, the power converter 16 transfers energy from the high voltage bus 18 to the low voltage bus 20, for example, for continuous operation of all low voltage loads carried by the low voltage bus 20 such as low voltage DC loads of an electric or hybrid vehicle and/or recharging of the 12V battery.

The power system 10 may provide the signals to the controller 22 via a signal interface as set out in Table A, below.

TABLE A

| Signal | digital (d)/ analog (a)/ PWM | input (i)/ Output (o) |
|---|---|---|
| Enable | d | i |
| Buck/boost mode | d | i |
| Rated output voltage command | d | i |
| Faults | d | o |
| Power reduction because of over temperature | d | o |
| Cooling request | d | o |
| Actual 12 V LV-BUS current | d | o |
| Actual 12 V LV-BUS voltage | d | o |
| Actual HV-BUS current | d | o |
| 12 V supply | a | i-Supply |
| Signal ground | a | i-Supply |

Suitable input characteristics for an example power converter 16 operating in boost mode are set out in Table B, below.

TABLE B

| Characteristics | Values |
|---|---|
| Input voltage/ Output power: | 7.0-8.5 V: linearly increase maximum output power from 0 kW to 2.3 kW<br>8.5-10.5 V: linearly increase maximum output power from 2.3 kW to 3.0 kW<br>>10.5 V: maximum output power 3.0 kW |
| Control voltage: | DC/DC control shall be maintained down to 7.0 V |
| Maximum input voltage: | (16 V for operation and 24 V/1 minute survive without operation). |

Suitable output characteristics for an example power converter 16 operating in boost mode are set out in Table C, below.

TABLE C

Figure 7:
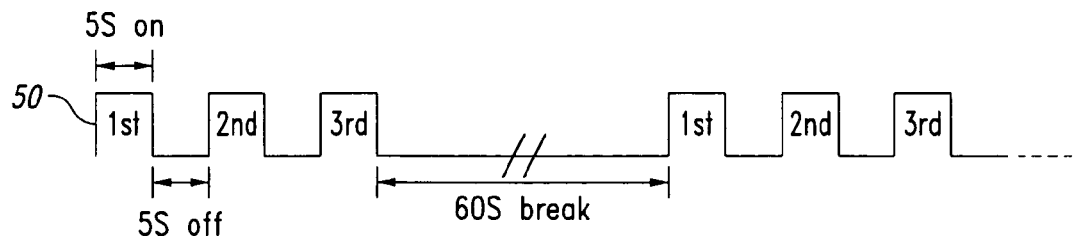
FIG. 7 is schematic diagram of a load pattern for the power converter operating in boost mode according to one illustrated embodiment.
Figure 8:
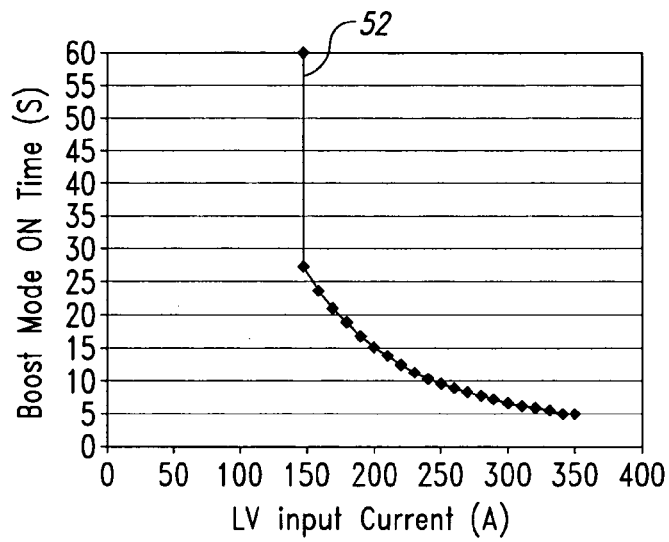
FIG. 8 is a schematic diagram of an estimated ON time curve for operation of the power converter while maintaining a thermal condition of the power converter within acceptable limits.
Figure 9:
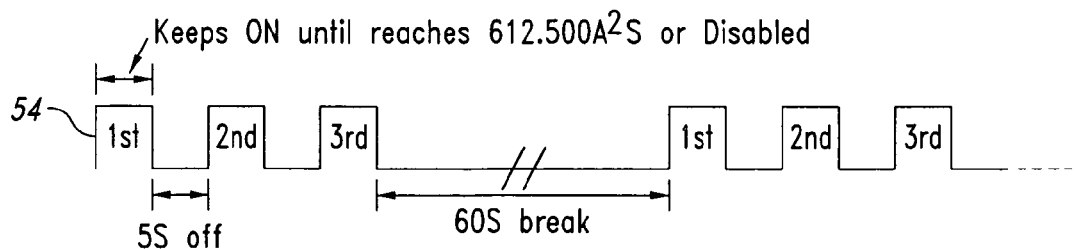
FIG. 9 is schematic diagram of a load pattern for the power converter operating in boost mode according to another illustrated embodiment, showing the flexibility in operation of the power converter while maintaining a thermal condition of the power converter within acceptable limits.

| Characteristics | Values | |
|---|---|---|
| Output voltage during start-up: | From 0 V to maximum stabilized output voltage in ≦0.6 seconds under start-up load condition | |
| Start-up load condition: | C = 13 mF, R = 1.7 kΩ (total HV bus discharge resistance) | |
| Stabilized output voltage | Input Voltage | Output Voltage |
| range: | 8.5 V-11 V | From 250 V ± 2% to 424.8 V ± 2%, derated by the power |
| | 11 V-13 V | 250 V ± 2%-424.8 V ± 2% |
| | 13 V-16 V | 300 V ± 2%-424.8 V ± 2% |
| Overvoltage protection: | 426.8 V ± 2% (Overvoltage protection is 2 V over max. stabilized output voltage) | |
| Redundant overvoltage protection: | 440.6 V ± 1% | |
| Max. voltage overshot at load dump: | 5 V | |
| Maximum output voltage: | 450 V | |
| Maximum output power: | 3 kW | |
| Load Pattern | See FIGS. 7-9 | |

Figure 3:
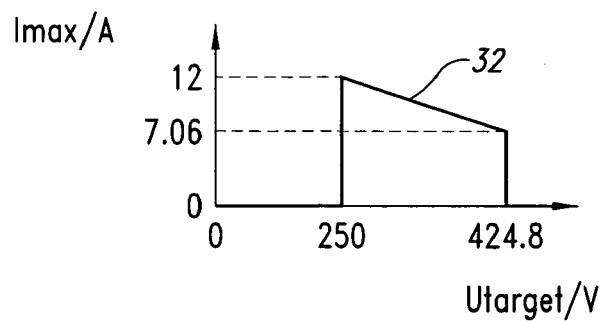
FIG. 3 is a graph illustrating a voltage/current characteristic of a power converter operating in a boost mode according to one illustrated embodiment.

FIG. 3 shows a line 32 illustrating a boost mode regulated voltage/current characteristic of the power converter 16 operating at 3 kW according to one illustrated embodiment.

Suitable input characteristics for an example power converter 16 operating in buck mode are set out in Table D, below.

TABLE D

| Characteristics | Values |
| --- | --- |
| Input voltage/ Output current: | 200-230 V: Approximately linearly increase max output current from 120 A at 200 V to 150 A at 230 V. 230-440 V: maximum output current 150 A |
| Transients and spikes: | The DC/DC delivers stabilized output voltage and current characteristics during the FCS flow switch condition, thus a voltage drop will occur. |

Suitable output characteristics for an example power converter 16 operating in buck mode are set out in Table E, below.

TABLE E

| Characteristics | Values |
| --- | --- |
| Stabilized output voltage range: | 13.3 V ± 2% to 14.4 V ± 2% with input voltage >250 V. |
| Reduced stabilized output voltage: | Approximately linearly increase output voltage from 11 to 13.3 V as input voltage increases 200-250 V. |
| Maximum output current: | (At high load the DC/DC should hold the max. current of 150 A down to 8.5 V, then approximately linear reduction from 150 A at 8.5 V to 0 A at 7 V) |
| Maximum output power: | 2 kW |
| Load pattern: | Continuously |
| High Temperature Buck Mode Operation: | With coolant inlet temperature above 72° C., output current should be derated approximately linearly (see FIG. 5). |

Figure 4:
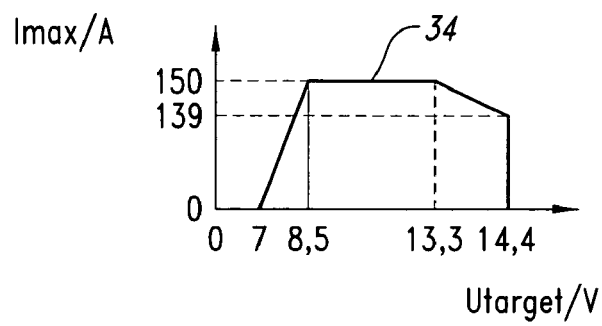
FIG. 4 is a graph illustrating a voltage/current characteristic of a power converter operating in a buck mode according to one illustrated embodiment.

FIG. 4 shows a line 34 of a voltage/current characteristic for the power converter 16 operating in buck mode according to one illustrated embodiment.

Figure 5:
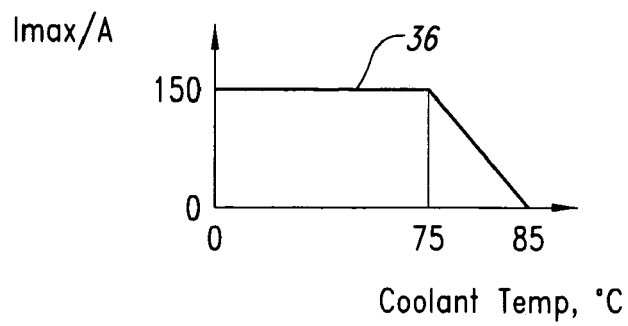
FIG. 5 is a graph illustrating an output current versus coolant temperature characteristic of a power converter according to one illustrated embodiment.

FIG. 5 shows a line 36 illustrating an output current versus coolant temperature characteristic of the power converter 16 according to one illustrated embodiment.

Figure 6:
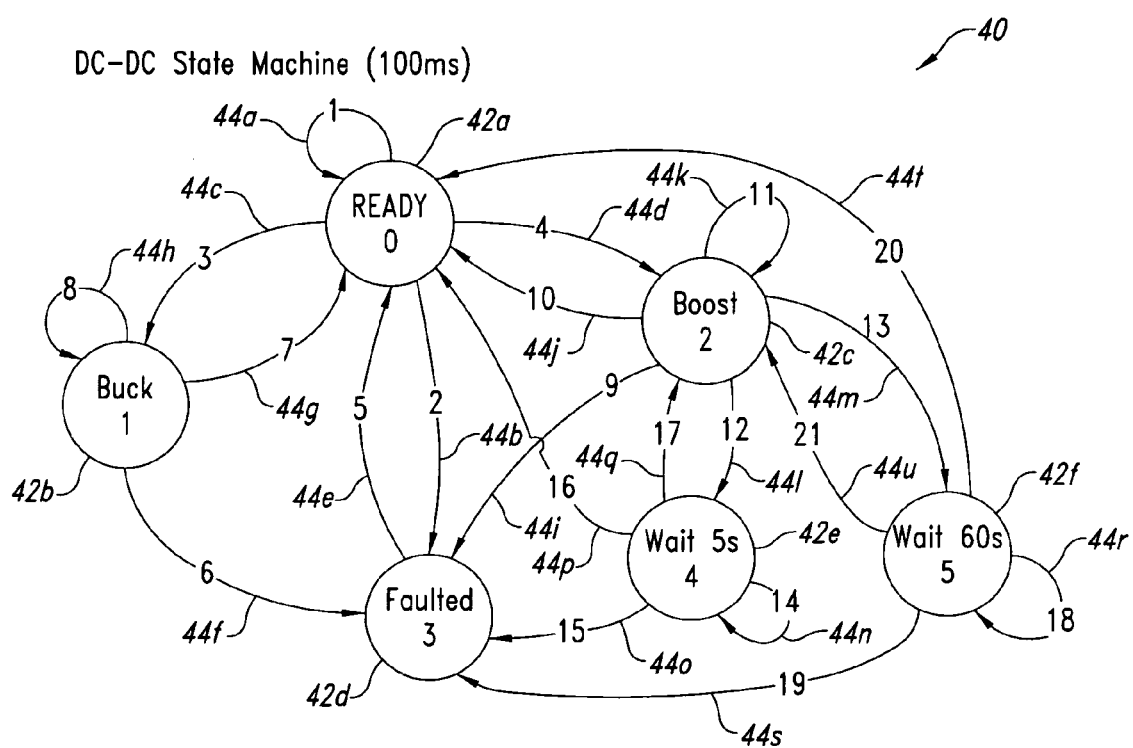
FIG. 6 is a schematic diagram of a state machine, illustrating a method of operating the power converter of FIG. 1 according to one illustrated embodiment.

FIG. 6 shows a state machine 40 implemented by the controller 22 (FIG. 1) in controlling the power converter 16.

The state machine 40 comprises a number of distinct states including: a ready state 42a, buck state 42b, boost state 42c, faulted state 42d, short wait state (e.g., wait 5 seconds) 42e, long wait state (e.g., wait 60 seconds) 42f, the order of the states being denominated in the circles representing the states as 0-5, respectively. The state machine 40 comprises a number of transitions defined between the states, the transitions illustrated by arrows 44a-44u, the order of the transitions being denominated between the head and tail of the arrows as 1-21, respectively. The transition order implies precedence. Thus, for example, if the state is Boost 42c, the condition for the transition 44m to the state Wait 60 seconds 42f is checked first, and if the condition is TRUE the state transition is made without checking any other conditions.

Outputs are persistent, thus if no action is taken to change any of the outputs during a given execution of the state machine 40, the last values for all of the outputs will be used. If none of the conditions for state transition are met, the state does not change, and no actions are taken. Only one state transition occurs per execution of the state machine 40. An appropriate fault bit is set if, and when, a fault occurs. A hardware, software or EPO fault detected by the power converter 16 or an integrated power train is identified as a DC_DC_FAULT.

Table F shows a number of suitable values for a pair of operating parameters for an example power converter 16, that may be calibrated.

TABLE F

| Calibratable Parameter Name | Description (Units) | Nominal value | Range |
| --- | --- | --- | --- |
| DC_HVOV | Threshold HV voltage above which the DC/DC converter is disabled | 440.6 | RANGE_V |
| DC_MIN_OFF_TIME | Minimum time that the DC/DC converter is disabled before re-enabling. (Seconds) | 2 seconds | |

The operation of the state machine 40 is set out in Table G, immediately below.

TABLE G

| Transition # | Starting State | Ending State | Conditions to Transit | Actions at the Transition |
| --- | --- | --- | --- | --- |
| 1 | READY | READY | TIMER_MODE < DC_MIN_OFF_TIME or DC/DC Disabled commanded | If TIMER_MODE <= DC_MIN_OFF_TIME Then Increment TIMER_MODE End |
| 2 | READY | FAULTED | Hardware or software fault | Set Disable DC/DC Set CAN bit or bytes associated to the fault |
| 3 | READY | BUCK | DC/DC Enabled commanded and Buck Mode selected | Set DC_DC_MODE to Buck Enable DC/DC Set TIMER_MODE = 0 Set CAN bit DCLV buck on = 1 |
| 4 | READY | BOOST | DC/DC Enabled Commanded and Boost Mode selected | Set DC_DC_MODE to Boost Enable DC/DC If TIMER_WAIT>=60 Then Set DCLV 3 times enabled = 0 End If TIMER_WAIT >= 5 |

TABLE G-continued

| Transition # | Starting State | Ending State | Conditions to Transit | Actions at the Transition |
|---|---|---|---|---|
| | | | | Then<br>Set CAN Bit DCLV break = 0<br>Set CAN Bit DCLV 90% $I^2$t = 0<br>Set $I^2$t = 0<br>End<br>Set TIMER_MODE = 0<br>Set CAN bit DCLV Boost on = 1 |
| 5 | FAULTED | READY | Auto-resume fault cleared or DC/DC Disabled commanded | Clear CAN bit or bytes associated to the fault |
| 6 | BUCK | FAULTED | Hardware or software fault | Disable DC/DC<br>Set CAN bit or bytes associated to the fault<br>Set CAN bit DCLV buck on = 0 |
| 7 | BUCK | READY | DC/DC Disabled commanded or Boost Mode selected | Set Disable DC/DC<br>Set TIMER_MODE = 0<br>Set CAN bit DCLV buck on = 0 |
| 8 | BUCK | BUCK | | Detect Hardware fault or power reduction |
| 9 | BOOST | FAULTED | Hardware or software fault | Disable DC/DC<br>Set CAN bit DCLV Boost on = 0<br>Set CAN bit or bytes associated to the fault |
| 10 | BOOST | READY | DC/DC Disabled commanded or Buck Mode selected | Disable DC/DC<br>Set TIMER_MODE = 0<br>Set CAN bit DCLV Boost on = 0 |
| 11 | BOOST | BOOST | ($I^2$t < 2,450,000 $A^2$sec and igbt_temp <=0)<br>or<br>($I^2$t < 612,500 $A^2$sec and igbt_temp > 0) | If LV I > 150 A<br>Then<br>Increment $I^2$t by $\int idt$<br>  If ($I^2$t > 2,450,000 $A^2$sec * 90% and<br>  igbt_temp <=0) or ($I^2$t > 612,500 $A^2$sec<br>  * 90% and igbt_temp > 0)<br>  Then<br>  Set DCLV 90% $I^2$t<br>  End<br>End<br>Detect Hardware fault or power reduction |
| 12 | BOOST | WAIT 5S | COUNT < 3 | Disable DC/DC<br>Increment COUNT<br>Set TIMER_WAIT = 0<br>Set CAN bit DCLV break = 1<br>Set CAN bit DCLV Boost on = 0 |
| 13 | BOOST | WAIT 60S | COUNT >= 3 | Disable DC/DC<br>Set COUNT = 0<br>Set TIMER_WAIT = 0<br>Set CAN bit DCLV 3 times enabled = 1<br>Set CAN bit DCLV Boost on = 0 |
| 14 | WAIT 5S | WAIT 5S | TIMER_WAIT < 5 seconds | Increment TIMER_WAIT |
| 15 | WAIT 5S | FAULTED | Hardware or software fault | Disable DC/DC<br>Set CAN bit or bytes associated to the fault |
| 16 | WAIT 5S | READY | DC/DC Disabled commanded or Buck Mode selected | |
| 17 | WAIT 5S | BOOST | TIMER_WAIT >= 5 seconds | Enable DC/DC<br>Set $I^2$t = 0<br>Set TIMER_WAIT = 0<br>Set CAN Bit DCLV 90% $I^2$t = 0<br>Set CAN Bit DCLV break = 0<br>Set CAN bit DCLV Boost on = 1 |
| 18 | WAIT 60S | WAIT 60S | TIMER_WAIT < 60 seconds | Increment TIMER_WAIT |
| 19 | WAIT 60S | FAULTED | Hardware or software fault | Disable DC/DC<br>Set CAN bit or bytes associated to the fault |
| 20 | WAIT 60S | READY | DC/DC Disabled commanded or Buck Mode selected | |
| 21 | WAIT 60S | BOOST | TIMER_WAIT >= 60 seconds | Enable DC/DC<br>Set $I^2$t = 0<br>Set TIMER_WAIT = 0<br>Set TIMER_HW = 0<br>Set CAN bit DCLV 90% $I^2$t = 0<br>Set CAN bit DCLV 3 times enabled = 0<br>Set CAN bit DCLV Boost on = 1 |

When operating In boost mode, some exemplary efficiencies for the power converter 16 are: 1) greater than 80% from 30% $P_{max}$ to $P_{max}$ (8.5V<ULV<11V); and 2) greater than 85% from 30% $P_{max}$ to $P_{max}$ ($U_{LV}$ equal to or greater than 11V). When operating in buck mode some exemplary efficiencies for the power converter 16 are: 1) greater than 85% from 30% $P_{max}$ to $P_{max}$ ($U_{HV}$ equal to or greater than 350V); and 2) greater than 88% from 30% $P_{max}$ to $P_{max}$ (250V<$U_{HV}$<350V).

In some embodiments, the output voltage may vary by approximately 2% from the rated voltage in both boost and buck modes. An AC overlay in the load circuit may be lower than 3% TRMS against the average value.

Table H shows a number of example fault conditions, with corresponding variable names, data types, error types, reset values, and comments.

TABLE H

| Variables | Datatype | Error Type | Reset/Clear Conditions | Comments |
|---|---|---|---|---|
| DCLV general error | bit | C3/C4 | The general error is reset if all errors are cleared | The general error is set if one of the following errors occurs: DCLV CAN Error, DCLV HV bus over current, DCLV HV bus over voltage buck, DCLV LV bus over current buck, DCLV LV bus under voltage, DCLV LV bus over voltage, DCLV LV over current boost, DCLV over temperature, DCLV LV Measurement Error, DCLV InterlockSignal Error, DCLV HV bus undervoltage and DCLV HW error. It is also set, if an error occurs which is not displayed. It could be the case in boost mode for: DCLV HVOV_BST (HV V < HV cmd - 30 V) or (HV V <220 V) for more than 1 s When the VSC enables the boost mode but HV V - 10 V > HV cmd if boost mode is enabled and the corresponding Siadis bit is not set |
| DCLV CAN Error | bit | C3 | Set conditions: According CAN class C Specification, chapter "monitoring of incoming messages" and "Behavior - Bus off" Reset conditions: The DC/DC is re-enabled as soon as a fault condition is cleared | The error is active at "CAN timeout" and "CAN bus off". |
| DCLV HV bus over current | bit | C4 | Disable and re-enable the DC/DC and the absolute value of HV current should be less than the specified limit | The absolute value of HV current was more than 15 A in boost mode, 10 A in buck mode |
| DCLV HV bus over voltage buck | bit | C3 | The HV voltage should be less than the set condition minus 3 V | The HV voltage was more than 445 V ±2% (HW limit) or 440 V ±1% (SW limit) |
| DCLV LV bus over current buck | bit | C4 | Disable and re-enable the DC/DC and the LV current should be less than the specified limit | The LV current was more than 170 A. |
| DCLV LV bus under voltage | bit | C4 | Disable and re-enable the DC/DC and the LV voltage should be more than the specified limit | The LV voltage was less than 6.3 V |
| DCLV LV bus over voltage | bit | C3 | The LV voltage should be less than 15.3 V | The LV voltage was more than 16 V |
| DCLV LV over current boost | bit | C4 | Disable and re-enable the DC/DC and the LV current should be less than the specified limit | The LV current was more than 370 A |
| DCLV over temperature | bit | C4 | Disable and re-enable the DC/DC and temperature has to be less than 83 deg C. | The coldplate temperature was more than 85 deg C. |
| DCLV temperature reduction active | bit | C1 | The temperature should be less than 74 deg C. | The coldplate temperature was more than 75 deg C. |
| DCLV buck on | bit | n/a | Set to 0 if the DC/DC state is different from set condition | Set to 1 if the DC/DC state is "Buck" |
| DCLV boost on | bit | n/a | Set to 0 if the DC/DC state is different from set condition | Set to 1 if the DC/DC state is "Boost" or "Wait 5 s" or "Wait 60 s" |
| DCLV reduction buck | bit | C2 | The HV has to be more than 235 V | The DC/DC is enabled and the HV voltage is less 230 V. The DC/DC can not provide the maximum output power if required |
| DCLV reduction power boost | bit | C2 | The LV has to be more than 9 V | The DC/DC is enabled and the LV voltage is less 8.5 V. The DC/DC can not provide the maximum output power if required |
| DCLV LV Measurement | bit | C3 | The difference between the LV voltage has to be less than 1.5 V | active, if a difference >2 V between IPT LV measuring and DC/DC LV measuring for t > 1 sec |

TABLE H-continued

| Variables | Datatype | Error Type | Reset/Clear Conditions | Comments |
|---|---|---|---|---|
| Error | | | | occurs (auto resume) Hysteresis: active >2 V, inactive <1.5 V |
| DCLV InterlockSignal Error | bit | C4 | Disable and re-enable the DC/DC and the interlock signal has to be detected | The interlock signal is the same than in the message 278(h) |
| DCLV 90% I2t | bit | n/a | After 5 sec break (respective 60 sec), if the DC/DC is not enabled once more at break | Shows that 90% of the actual $I^2t$ value is reached |
| DCLV break | bit | n/a | After 5 sec break (respective 60 sec), if the DC/DC is not enabled once more at break | Shows that the DC/DC reached the actual $I^2t$ value and is in a 5 sec break (if 3 times enabled in a 60 sec break instead of 5 sec) |
| DCLV 3 times enabled | bit | n/a | After 60 sec break, if the DC/DC is not enabled once more at break | Shows that the DC/DC is enabled 3 times |
| DCLV > 0° C. | bit | n/a | The IGBT temperature is less than 0 deg C. and because of that the I2t value is 2,450,000 A2sec | The IGBT temperature is more than 1 deg C. and because of that the I2t value is 612,500 A2sec |
| DCLV HV bus undervoltage | bit | C3 | The bit is cleared if (HV voltage >203 V) OR (CAN Bit ECU_DcLvEn = 0) | The bit is set if (HV voltage <200 V) AND (Buck On or Boost On) AND (timer >2 sec) |
| DCLV HW error | bit | C3 | The bit is cleared if (Buck AND (LV V measured > LV V cmd − 0.7 V threshold) OR HV V <200 V) or (Boost AND (HV V measured > HV V cmd − 20 V threshold) | The bit is set if [ (ECU_DcLvMode=0 AND (LV V measured < LV V cmd − 1 V threshold) AND HV i < 0.1 A AND HV V >203 V) OR (ECU_DcLvMode=1 AND (HV V measured < HV V cmd − 30 V threshold) AND HV i < 0.1 A) ] AND [ECU_DcLvEn = 1] AND [timer >1 second] |
| DCLV error exits in error store | bit | n/a | Clear error store | Indicates that an error (only DCLV) has occurred sometime in the past and is stored in the IPT non volatile memory. This is just a status information for the VCU |

Remarks:
C1: Active output power reduction from the DC/DC
C2: Passive output power reduction due to external condition
C3: DC/DC is disabled. It is re-enabled as soon as the fault condition is cleared.
C4: DC/DC is faulted and then shuts down. It can be disabled to clear the fault.

FIG. 7 shows one load pattern 50 for a power converter 16 operating in boost mode. In particular, the power converter 16 is alternatingly switched between an ON state for 5 seconds and an OFF state for 5 seconds, which is repeated three times and followed by a 1 minute break, where the coolant is at approximately 72° C. at a flow rate of 8 liters/minute. A more flexible approach may be desirable.

In an ideal case, the boost mode would be able to run forever, at least until the low voltage power source (e.g., 12V battery and/or ultracapacitors) are discharged. Of course, some power converter 16 designs will overheat if forced to operate essentially continuously, due, for example, to thermal limitations which may exist where the thermal design was primarily based on the load pattern illustrated in FIG. 7.

The load pattern may be changed in a flexible manner, instead of a fixed load pattern 50, while maintaining a thermal condition equivalent to that of the load pattern of FIG. 7. For example, if the low voltage input current is 150 A or less, the power converter 16 operating in boost mode is capable of running continuously, because the thermal condition in this case is equivalent to the thermal condition in buck mode operation. Thus, an indication of the thermal condition may be a function of an input current.

It is however, difficult to predict the boost mode ON time precisely, particularly since it is related to many factors, such as coolant temperature, coolant flow rate, operating history, power level and duration. Using $I^2t$-criteria as an indication of the thermal condition may be useful.

In one embodiment, 350 A with 5 second duration would have an $I^2t$ value of 612,500 $A^2S$. If the input current reduced in half, the boost mode ON time can be extended as long as 20 seconds to allow the same amount of $I^2t$ pass through. Using the same method, results in a boost mode ON time estimation curve 52 are illustrated in FIG. 8.

The proposed load pattern change would, instead of setting a 5 second fixed boost mode ON time, would allow the integrated powertrain (IPT) software to calculate the ON time based on the low voltage input $I^2t$. Once the low voltage input $I^2t$ reaches the 612,500 $A^2S$, the IPT software disables boost mode, sending a message back to a vehicle controller indicating that the power converter boost mode goes into a 5 second break period. After the 5 second break, the vehicle controller may enable the power converter boost mode again. If the vehicle controller enables the power converter boost mode during the 5 second break period, the IPT controller will hold the command until the 5 second break period ends.

In reality the low voltage input current LV_I is not constant, thus the controller may employ an integral operation (e.g., $\int I^2 dt$) to accumulate the total $I^2t$. Since the boost mode can run continuously at 150 A or less, the integral only counts when the low voltage input current LV_I is greater than 150 A.

FIG. 9 shows a proposed boost mode load pattern 54.

In boost mode in some embodiments, if the battery voltage is over, for example, 13V for a short period of time, there will be no problem. Where the low voltage power source is a battery, the battery terminal voltage will drop under 13V once the battery is loaded.

In one embodiment, the start-up load condition in boost mode is 1.7 kOhm/13 mF, in which 1.7 kOhm is the total bleeding resistance, and the 13 mF is the total HV bus capacitance. It is possible to loosen the capacitance limitation if this requirement does not completely reflect a real situation, such as that for a vehicle. It is also possible to implement a high voltage capacitance in power system 10, for example a high voltage capacitance of between 8.4 mF and 13 mF. In such a case, an additional bleeding resistance, other than 2.5K inside the integrated power train, should be added to make sure boost operation starts up properly, because the DC/DC in boost mode takes advantage of the 1.7 kOhm bleeding resistor for a minimum load. If the command voltage in boost mode is higher than 250V, the resistance could be higher than 1.7 kOhm to keep the same minimum load. Table I, below, shows the total resistance and the additional resistance at different voltages. If the commanded high voltage is higher than 310V, no extra resistance is needed.

TABLE I

| | HV CMD Voltage (V) | | | | | | |
|---|---|---|---|---|---|---|---|
| | 250 | 260 | 270 | 280 | 290 | 300 | 310 |
| Total resistance (Ohm) | 1700 | 1839 | 1983 | 2133 | 2288 | 2448 | 2614 |
| Additional parallel resistance (Ohm) | 5315 | 6955 | 9592 | 14519 | 26955 | 118421 | |

The power system 10 may employ a number of hardware and/or software implemented protections. For example, a first hardware implemented overvoltage protection scheme may limit high voltage in buck mode to 445V while a second hardware implemented overvoltage protection scheme limits high voltage in boost mode to 426.8V. Additionally, or alternatively, a software implemented overvoltage protection scheme may limit high voltage to 440V.

Figure 10:
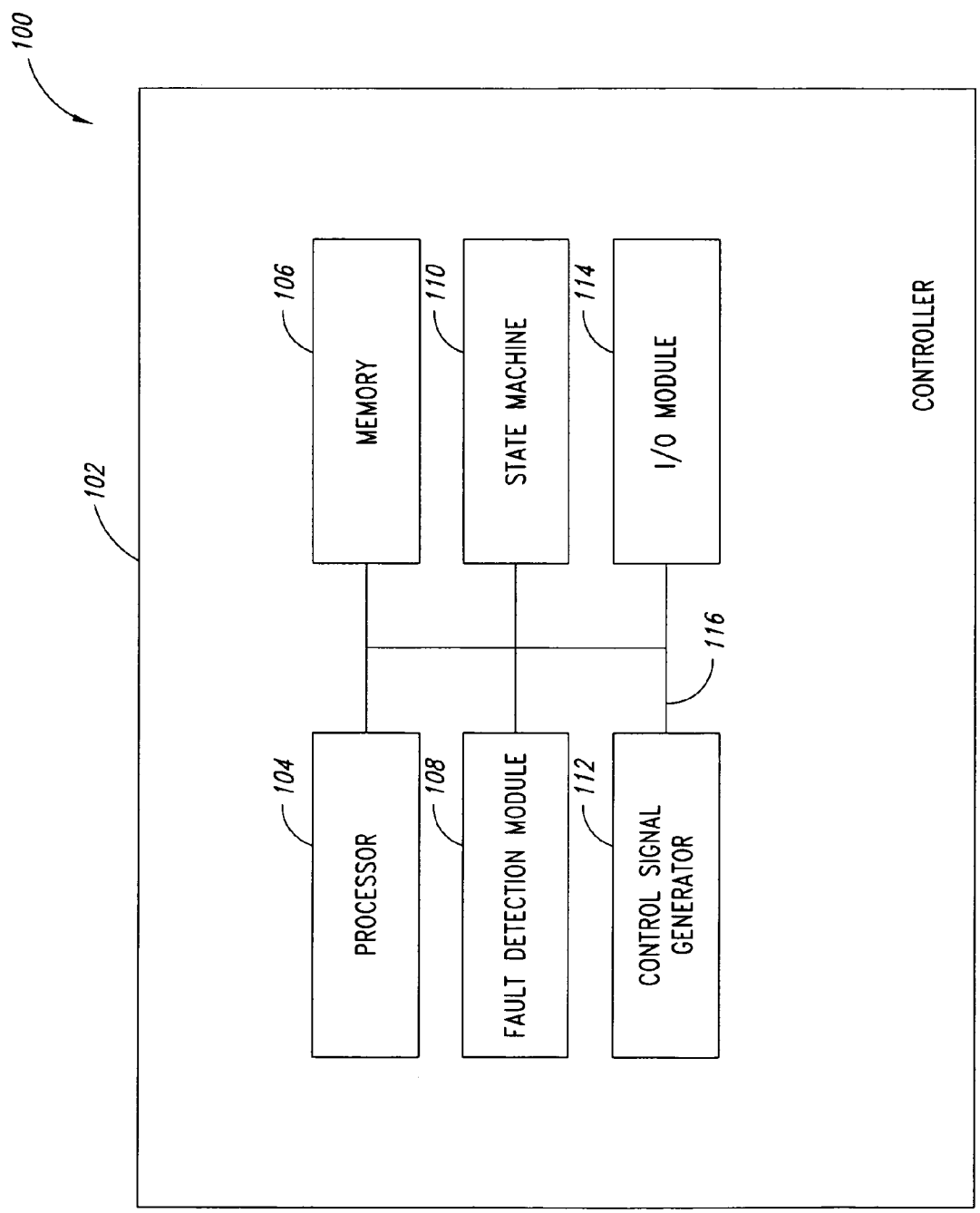
FIG. 10 is a functional block diagram of a system for controlling a power converter according to one embodiment.

FIG. 10 shows a functional block diagram of an embodiment of system 100 for controlling a power converter. The system 100 comprises a controller 102. In the embodiment illustrated in FIG. 10, the controller 102 comprises a processor 104, a memory 106, a fault detection module 108, a state machine 110, a control signal generator 112, an I/O module 114 and a controller system bus 116. The control system bus 116 may comprise a power bus, control bus, and status signal bus in addition to a data bus. For the sake of clarity, however, the various control system buses are illustrated in FIG. 10 as the controller system bus 116.

The controller 102 may be implemented in a variety of ways, including as separate subsystems. The controller 102 may be implemented as a microprocessor, a digital signal processor (DSP), an application-specific integrated circuit (ASIC), a gate-driver board, or the like, or as a series of instructions stored in a memory, such as the memory 106 and executed by a processor, such as the processor 104, or various combinations of the above. Thus, software modifications to existing hardware may allow the implementation of the controller 102. Various modules, such as the state machine 110, are identified as separate blocks in the functional block diagram of FIG. 10 because they perform specific functions that will be described in more detail below. These modules may not be discrete units but may be functions of a software routine, which will probably, but not necessarily, be separately callable and hence identifiable elements. The various modules may be combined. For example, all or portions of the fault detection module 108 may be integrated into the state machine 110, which in turn may be integrated into the control signal generator 112.

While the illustrated embodiment denotes a single processor 104, other embodiments may comprise multiple processors. The memory 106 may comprise, for example, registers, read only memory ("ROM"), random access memory ("RAM"), flash memory and/or electronically erasable programmable read only memory ("EEPROM"), and may provide instructions and data for use by the controller 102.

The fault detection module 108 determines whether conditions exist indicating a system fault and generates fault signals in response thereto. For example, the fault detection module may monitor system conditions as indicated by sensors 26a, 26b, 28a, 28b and control signals to determine whether a fault condition exists such as the fault conditions set forth in Table H. In response to detection of a fault condition, the fault detection module may generate fault signals.

The state machine 110 comprises a number of distinct states, such as those described above with respect to FIG. 6 and Table G. The control signal generator 112 may generate control signals for controller a power converter (such as the converter 16 illustrated in FIG. 1) based on a state of the state machine 110 and any fault signals generated by the fault detection module 108. The I/O module 114 facilitates reception and transmission of signals, such as data and control signals, by the controller 102.

Those skilled in the relevant art can readily create source code based on the Tables, Figures and the detailed description provided herein.

The term "computer-readable medium" as used herein refers to any medium that participates in providing instructions to a system or a processor for execution. Such a medium may take many forms, including but not limited to, non-volatile media, volatile media, and transmission media. Non-volatile media includes, for example, hard, optical or magnetic disks. Volatile media includes dynamic memory. Transmission media includes coaxial cables, copper wire and fiber optics. Transmission media can also take the form of acoustic or light waves, such as those generated during radio wave and infrared data communications.

Common forms of computer-readable media include, for example, a floppy disk, a flexible disk, hard disk, magnetic tape, or any other magnetic medium, a CD-ROM, any other optical medium, punch cards, paper tape, any other physical medium with patterns of holes, a RAM, a PROM, EPROM and an EEPROM, a FLASH-EPROM, any other memory chip or cartridge, a carrier wave, or any other medium from which a computer can read.

Various forms of computer readable media may be involved in carrying one or more sequences of one or more instructions to a processor for execution. For example, the instructions may initially be carried on a magnetic disk of a remote computer. The remote computer can load the instructions into its dynamic memory and send the instructions over a telephone line using a modem. A modem local to computer system can receive the data on the telephone line and use an infrared transmitter to convert the data to an infrared signal. An infrared detector coupled to a system bus can receive the data carried in the infrared signal and place the data on system bus. The system bus carries the data to system memory, from which a processor retrieves and executes the instructions. The instructions received by system memory may optionally be stored on storage device either before or after execution by the processor.

Although specific embodiments of, and examples for, the apparatus and method of bi-directional power conversion are described herein for illustrative purposes, various equivalent modifications can be made without departing from the spirit and scope of the disclosure, as will be recognized by those skilled in the relevant art. The teachings provided herein can be applied to other power systems, not necessarily the exemplary electric or hybrid vehicle based system generally described above. Likewise, the teachings provided herein can be applied to other power sources, not necessarily the exemplary fuel cell system, battery and/or ultracapacitors based power sources generally described above.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet, including but not limited to patents U.S. Pat. No. 5,402,059, issued Mar. 28, 1995; U.S. Pat. No. 6,646,837, issued Nov. 11, 2003; U.S. Pat. No. 6,452,815, issued Sep. 17, 2002; and U.S. Pat. No. 6,587,356, issued Jul. 1, 2003; U.S. application Ser. No. 10/658,559, filed Sep. 8, 2003; Ser. No. 09/683,317, filed Dec. 13, 2001; Ser. No. 10/118,659, filed Apr. 8, 2002; Ser. No. 09/848,482, filed May 3, 2001; Ser. No. 10/345,894, filed Jan. 15, 2003; Ser. No. 10/346,561, filed Jan. 16, 2003; Ser. No. 10/360,832, filed Feb. 7, 2003; and Ser. No. 10/298,473, filed Nov. 18, 2002; and U.S. Provisional Application Ser. No. 60/246,273, filed Nov. 6, 2000; Ser. No. 60/255,371, filed Dec. 13, 2000; Ser. No. 60/270,703, filed Feb. 22, 2001; Ser. No. 60/271,184, filed Feb. 23, 2001; Ser. No. 60/319,070, filed Jan. 16, 2002; Ser, No. 60/319,071, filed Jan. 16, 2002; and Sere. No. 60/319,116, filed Feb. 20, 2002; are incorporated herein by reference, in their entirety. Aspects of the disclosure can be modified, if necessary, to employ systems, circuits and concepts of the various patents, applications and publications to provide yet further embodiments.

These and other changes can be made to the disclosed embodiments in light of the above-detailed description. In general, in the following claims, the terms used should not be construed to limit the disclosure to the specific embodiments disclosed in the specification and the claims, but should be construed to include bi-directional power converter based systems and methods operate in accordance with the claims. Accordingly, the disclosure is not limited by the embodiments, but instead its scope is to be determined entirely by the following claims.

The invention claimed is:

1. A computer-readable memory medium storing instructions for causing a control system to control a power converter by:

monitoring command and condition signals; and selectively supplying control signals to cause the power converter to cycle between a plurality of operational modes based on the monitored command and condition signals, the plurality of operational modes comprising:

a ready mode;

a buck mode;

a boost mode;

a fault mode;

a first wait mode during which power transfer is disabled; and a second wait mode comprising a duration different than the first wait mode during which power transfer is disabled.

2. The computer-readable memory medium of claim 1, wherein the stored instructions further comprise instructions for causing the control system to control the power converter by:

selectively generating control signals to cause the power converter to cycle from the boost mode to the first wait mode; and selectively generating control signals to cause the power converter to cycle from the boost mode to the second wait mode.

3. The computer-readable memory medium of claim 1 wherein the stored instructions further comprise instructions for causing the control system to control the power converter by:

selectively supplying control signals to cause the power converter to cycle from the boost mode to the first wait mode in response to an indication of a thermal condition.

4. The computer-readable memory medium of claim 3 wherein the indication of a thermal condition is a function of an input current.

5. The computer-readable memory medium of claim 1, wherein the stored instructions include instructions for causing the control system to supply control signals to cause the power converter to cycle from the boost mode to the first wait mode when an integrated value of an input current exceeds a threshold input current by a defined value.

6. The computer-readable memory medium of claim 1, wherein the stored instructions include instructions for causing the control system to supply control signals to cause the power converter to operate in the fault mode in response to detection of a fault condition.

7. The computer-readable memory medium of claim 1, wherein the stored instructions include instructions for causing the control system to supply control signals to cause the power converter to operate in the first wait mode for a first defined period of time and selectively supplying control signals to cause the bi-directional power converter to operate in the second wait mode for a second defined period of time.

* * * * *